US009068265B2

(12) United States Patent
Lubomirsky et al.

(10) Patent No.: US 9,068,265 B2
(45) Date of Patent: Jun. 30, 2015

(54) GAS DISTRIBUTION PLATE WITH DISCRETE PROTECTIVE ELEMENTS

(75) Inventors: Dmitry Lubomirsky, Cupertino, CA (US); Kartik Ramaswamy, San Jose, CA (US); Kallol Bera, San Jose, CA (US); Jennifer Sun, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 649 days.

(21) Appl. No.: 13/363,342

(22) Filed: Jan. 31, 2012

(65) Prior Publication Data

US 2012/0193456 A1 Aug. 2, 2012

Related U.S. Application Data

(60) Provisional application No. 61/438,561, filed on Feb. 1, 2011.

(51) Int. Cl.
| | |
|---|---|
| *B05B 5/00* | (2006.01) |
| *B05B 1/14* | (2006.01) |
| *C23C 16/509* | (2006.01) |
| *C23C 16/455* | (2006.01) |
| *H01J 37/32* | (2006.01) |

(52) U.S. Cl.
CPC ........ *C23C 16/5096* (2013.01); *C23C 16/45563* (2013.01); *C23C 16/45565* (2013.01); *C23C 16/4557* (2013.01); *C23C 16/45572* (2013.01); *H01J 37/32091* (2013.01); *H01J 37/3244* (2013.01); *H01J 37/32559* (2013.01)

(58) Field of Classification Search
CPC .......... C23C 16/00; A01G 27/00; B05B 5/00; B05B 1/14; F23D 11/32
USPC ........ 118/715, 723 K, 723 VE, 723 R, 723 E; 156/345.34, 345, 345.33, 345.48; 239/556, 558, 568, 690, 690.1, 706, 239/548; 438/714; 216/67; 204/298.07, 204/298.33
See application file for complete search history.

(56) References Cited

U.S. PATENT DOCUMENTS

| | | | | |
|---|---|---|---|---|
| 5,888,907 | A * | 3/1999 | Tomoyasu et al. | 438/714 |
| 6,444,040 | B1 * | 9/2002 | Herchen et al. | 118/715 |
| 6,740,853 | B1 * | 5/2004 | Johnson et al. | 219/444.1 |
| 2004/0016636 | A1 * | 1/2004 | Yang et al. | 204/237 |
| 2005/0173569 | A1 * | 8/2005 | Noorbakhsh et al. | 239/690 |
| 2006/0191637 | A1 | 8/2006 | Zajac et al. | |
| 2007/0256786 | A1 * | 11/2007 | Zhou et al. | 156/345.34 |

* cited by examiner

*Primary Examiner* — Justin Jonaitis
(74) *Attorney, Agent, or Firm* — Patterson & Sheridan, LLP

(57) ABSTRACT

Embodiments of the present invention provide a gas distribution plate assembly having protective elements for plasma processing. The gas distribution plate assembly includes a base plate having a front side and a backside, and a plurality of protective elements in direct contact with the base plate. The protective elements cover the front side of the base plate to protect the base plate from a plasma processing environment during use.

20 Claims, 6 Drawing Sheets

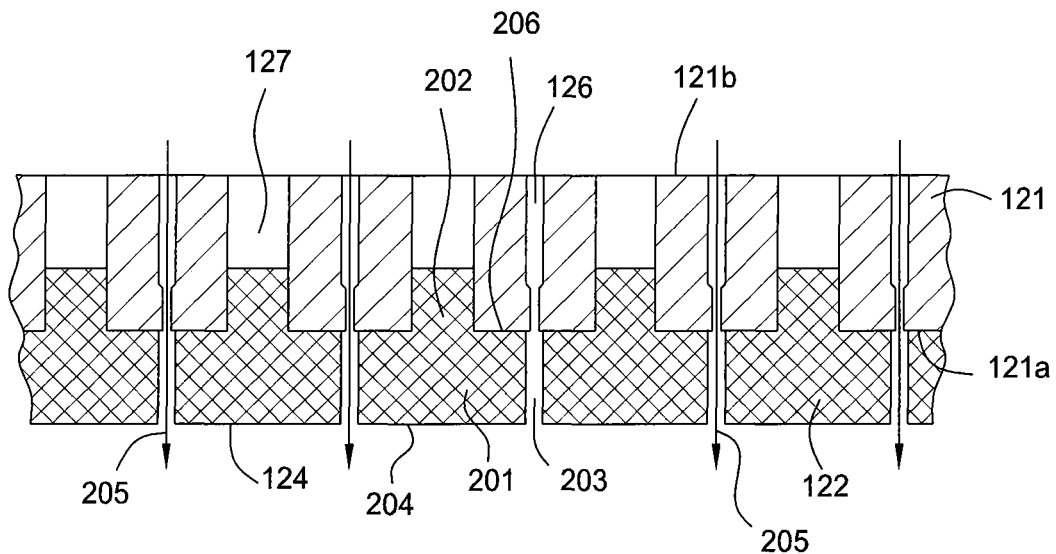
FIG. 2
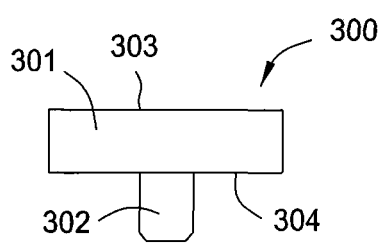
FIG. 3A  FIG. 3B
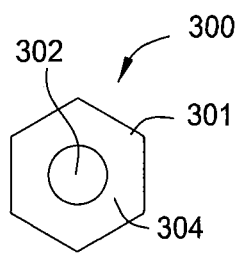
FIG. 3C
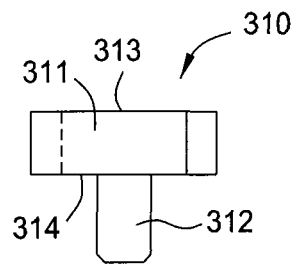
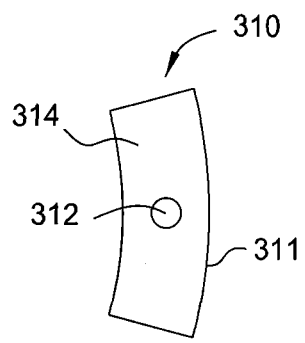
FIG. 3D
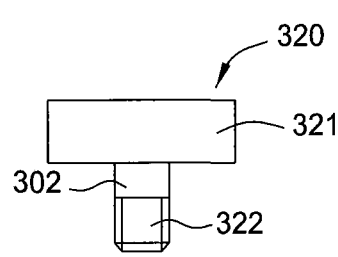
FIG. 3E
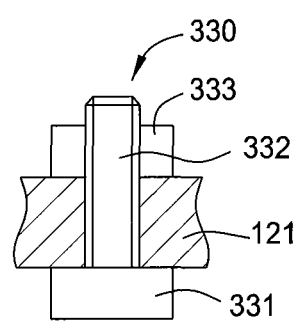
FIG. 3F

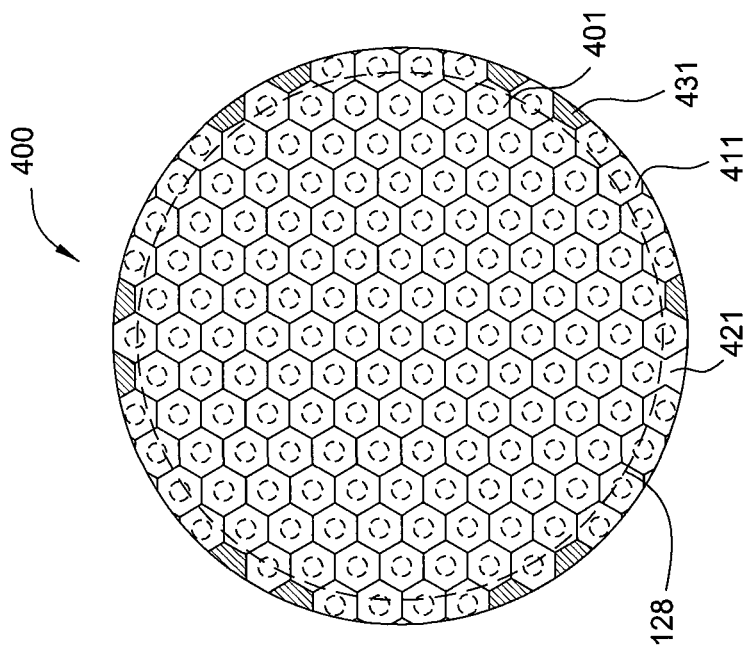
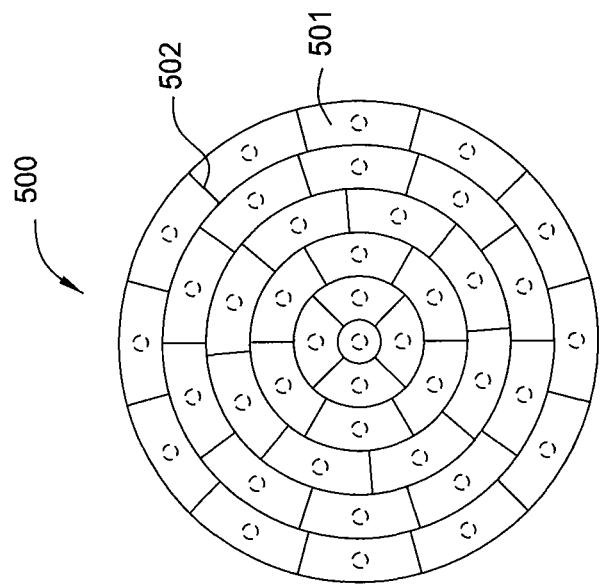
FIG. 5
FIG. 4

GAS DISTRIBUTION PLATE WITH DISCRETE PROTECTIVE ELEMENTS

CROSS-REFERENCE TO RELATED APPLICATIONS

This application claims benefit of U.S. Provisional Patent Application Ser. No. 61/438,561 filed Feb. 1, 2011, which is herein incorporated by reference.

BACKGROUND

1. Field of the Invention

Embodiments of the present invention relates to apparatus and methods processing a substrate with plasma. Particularly, embodiments of the present invention provide a gas distribution plate for supplying processing gas to a plasma processing chamber.

2. Description of the Related Art

During substrate processing, processing gases are generally delivered to a processing chamber through a gas distribution plate. A gas distribution plate usually includes a metal plate having a plurality of through holes or other passages formed therethrough for gas distribution. In a plasma processing chamber, the metal gas distribution plate is often used as an electrode connected to a RF power source or to the RF grounding path for generating capacitively coupled plasma. When a plasma is generated in the processing chamber, ions from the plasma bombard the metal gas distribution substrate, damaging the gas distribution substrate and generating metal particles which may contaminate the substrate during processing.

Traditional attempts to minimize the problems associated with metallic gas distribution plate include coating the metallic gas distribution plate with an inert ceramic coating or bonding a ceramic plate to the metallic gas distribution plate. However, both these approaches has drawbacks.

Ceramic coatings deposited on the metallic gas distribution plate are subject to variation across the gas distribution plate and variation from one gas distribution plate to another. Ceramic coated gas distribution plates may also introduce a higher level of metal contamination as a byproduct of plasma gun deposition techniques which tend to include metal from the gun with the deposited material. The coatings are normally non-volatile and may be sputtered by bombarding ions in the plasma. Additionally, the coated gas distribution plates include gas delivery holes which are exposed to the plasma environment. The plasma naturally forms a sheath, or positive space charge, near any exposed surface. Great design effort is needed to select the aspect ratio of the holes, convoluted line of sight of paths between gas plenum and plasma to prevent localized discharges of gas holes. However, these designs do not work for all pressure regimes, and localized discharge is particularly aggravated when the gas distribution plate is also connected to the RF power source.

Gas distribution plates having a bonded ceramic plate also has a number of drawbacks. First, the electric field generated in the chamber varies radially between the bonded ceramic plate and the metallic gas distribution plate due to differences in the flow of RF current in the space between the metallic plate and the bonded ceramic plate. The presence of the electric field due to the electrical potential difference between ceramic plate and the metallic gas distribution plate increases probability of localized discharge in the space between ceramic and the metallic plates. While great effort can be made to contour the exit hole, but the fact remains these holes have sharp radii greatly increases the electric field concentration in the region between the ceramic and the metallic pieces.

Secondly, the inherent variation of bonding material and bonding process may cause the gas distribution plate to vary laterally in temperature. Temperature control is particularly critical for etch processes where polymerizing gases are used, and any variation in temperature of the gas distribution plate may significantly impact etching performance, for example, loss of the etch profile control of holes and trenches due to poor control of the deposition of polymerizing gases during etching.

Additionally, bonding materials are also vulnerable to erosion due to chemical radical attack from the plasma. This is particularly problematic where metal containing bonding materials are used to increase thermal uniformity because the eroded bonding material then becomes a source of metallic contamination.

Furthermore, the bonded structure can only be used in a limited temperature range. The choice of bonding materials often limits the maximum service temperature of the gas distribution plate. Moreover, the ceramic plate and the metallic plate have coefficients of thermal expansion that are greatly different. When heated, the difference in thermal expansion between the ceramic and metallic plates may cause the bonding material to fail and/or the ceramic plate to crack.

Therefore, there is a need for an improved gas distribution plate assembly for use in plasma processing.

SUMMARY

Embodiments of the present invention provide a gas distribution plate assembly having protective elements that are coupled in a manner that substantially eliminates differences in electrical potential differences and thermal non-uniformity.

One embodiment of the present invention provides a gas distribution plate assembly that includes a plurality of protective elements coupled to a base plate. The base plate includes a plurality of gas delivery holes extending from a backside to a front side of the base plate. The protective elements substantially cover the front side of the base plate so that the plurality of gas delivery holes extending through the base plate cannot be seen from the front side of the base plate.

Another embodiment of the present invention provides a gas distribution plate assembly that includes a base plate having a front side and a backside, and a plurality of protective elements attached to the front side of the base plate. The plurality of protective elements form a top surface that is configured to face a processing environment. The plurality of protective elements are directly in contact with the base plate. The plurality of gas distribution paths extend from the backside of the base plate to the top surface. The gas distribution paths have a first portion formed through the base plate, and a second portion formed through and/or around the protective elements.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2 is a schematic partial sectional view of a gas distribution plate assembly according to one embodiment of the present invention.

FIG. 3A is a schematic side view of a protective element according to one embodiment of the present invention.

FIG. 3B is a schematic bottom view of the protective element of FIG. 3A.

FIG. 3C is a schematic side view of a protective element according to one embodiment of the present invention.

FIG. 3D is a schematic bottom view of the protective element of FIG. 3C.

FIG. 3E is a schematic side view of a protective element according to another embodiment of the present invention.

FIG. 3F is a schematic side view of a protective element according to another embodiment of the present invention.

FIG. 4 is a bottom view of a gas distribution plate assembly according to one embodiment of the present invention.

FIG. 5 is a bottom view of a gas distribution plate assembly according to another embodiment of the present invention.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention provide a gas distribution plate assembly for plasma processing. The gas distribution plate assembly includes a base plate and a plurality of discrete protective elements that are attached to and in direct contact with the base plate. The protective elements are discrete components that form a protective shield over the base plate.

In some embodiments of the invention, a gas distribution plate assembly is provided that includes a metallic base plate having a non-metallic protective cover attached directly in contact with the base plate without use of bonding material. In one embodiment, the non-metallic protective cover is formed by a plurality of protective elements attached to the metallic base plate. In one embodiment, the plurality of protective elements are arranged in a pattern over the metallic base plate. The protective elements may be arranged in a hexagonal arrangement, concentric rings, arc sectors or other geometrical pattern. Each of the protective elements may be interference fit, bolted or otherwise fastened to the metallic base plate.

In one embodiment, a plurality of gas distribution paths are formed through the base plate and the plurality of protective elements so that processing gas passes through the gas distribution plate assembly in a diffused manner. In one embodiment, the gas distribution paths extend through gaps defined between neighboring protective elements. In another embodiment, the gas distribution paths are defined through holes formed through the protective elements.

In one embodiment, the non-metallic protective elements are electrically conductive so that the protective elements are connected directly both electrically and thermally to the base plate within intervening materials or structures. Because no bonding material is present in between the protective elements and the metallic base plate, the protective elements and the base plate have the same electrical potential, thus creating a field free region within the gas distribution plate assembly. Therefore, processing gases may pass through the gas distribution plate assembly with low risk of plasma discharge. In one embodiment, the plurality of protective elements may partially overlap with one another to eliminate a direct line of sight between the metallic base plate and the plasma.

Because no bonding material is used, the gas distribution plate assembly according to embodiments of the present invention has a uniform thermal profile, reduced potential of localized plasma discharge and reduced potential to become a source of process contamination. Additionally, as the protective elements may be readily removed from the base plate, the base plate may be fitted with new protective elements without bonding material and reused, thereby reducing the cost of ownership and providing an environmentally friendly design.

Figure 1:
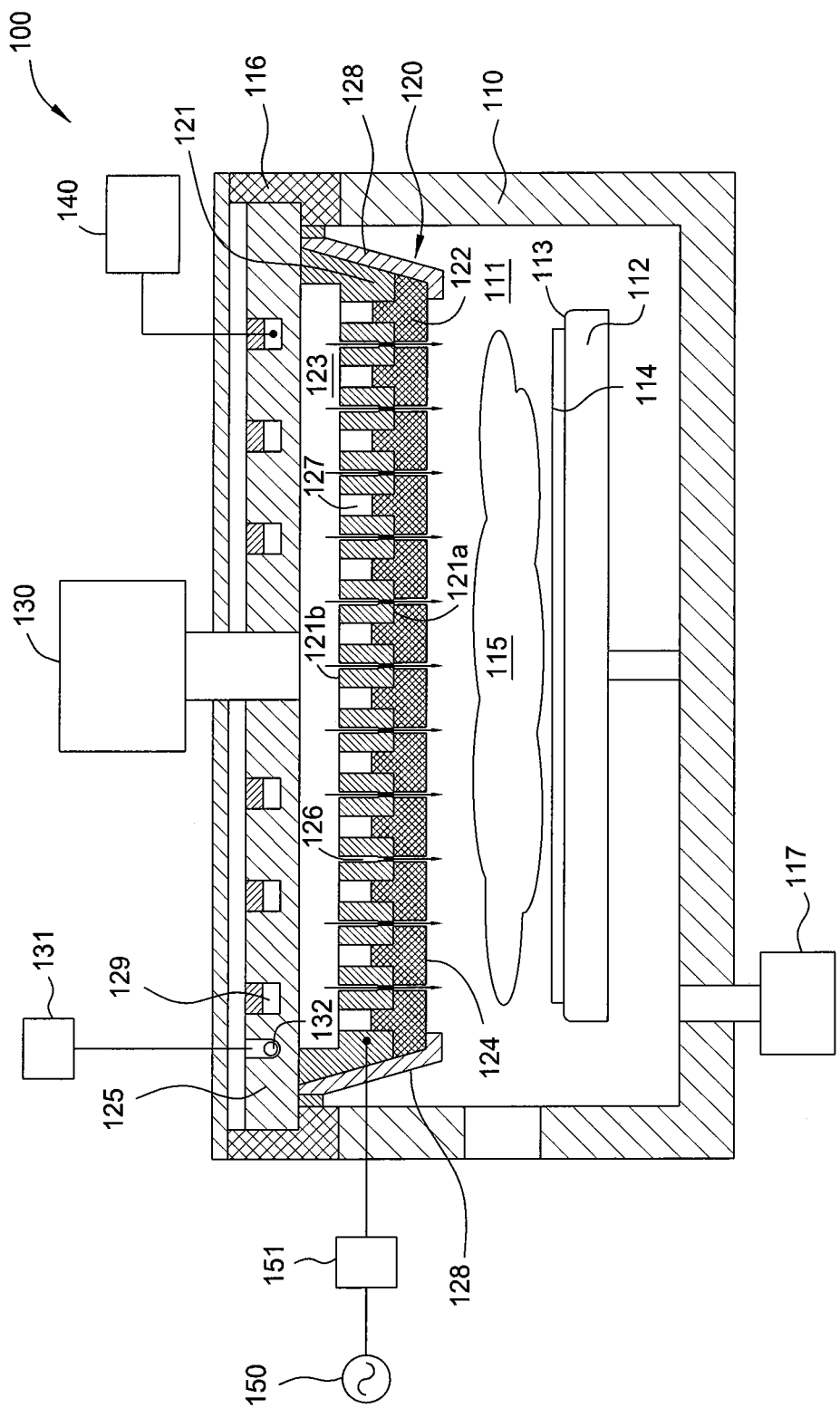
FIG. 1 is a schematic sectional view of an exemplary plasma processing chamber having a gas distribution plate assembly according to one embodiment of the present invention.

FIG. 1 is a schematic sectional view of an exemplary plasma processing chamber 100 having a gas distribution plate assembly 120 according to one embodiment of the present invention. Although the exemplary plasma processing chamber 100 of FIG. 1 is illustrated as an etch reactor, the inventive aspects of the gas distribution plate assembly may be utilized in other types of plasma processing chamber.

The plasma processing chamber 100 includes a chamber body 110 and a lid 125 which enclose a processing volume 111 therein. A substrate support assembly 112 and the gas distribution plate assembly 120 are is disposed in the processing volume 111. The substrate support assembly 112 is configured to support a substrate 114 on a substrate supporting surface 113 during processing. A vacuum pump 117 is fluidly connected to the processing volume 111 and configured to pump out the processing volume 111 and/or maintain a vacuum condition in the processing volume 111.

The gas distribution plate assembly 120 is coupled to the lid 125 and has a plurality of gas delivery paths (indicated by arrows) 205 formed therethrough for delivering processing gas into the interior volume 111. The lid 125 may be temperature controlled and thereby control the temperature of the gas distribution plate assembly 120. The lid 125 may have one or more cooling channels 129 and/or one or more resistive heating elements 132. The cooling channels 129 may be connected to a cooling fluid source 140. Cooling fluid from the cooing fluid source 140 may circulate in the cooling channels 129 to maintain and/or control the temperature of the lid 125 and the gas distribution plate assembly 120. The resistive heating elements 132 may be connected to a power source 131. The resistive heating elements 132 may be used to maintain and/or control the temperature of the lid 125 and the gas distribution plate assembly 120, along or in cooperation with the cooling channels 129.

In one embodiment, a plenum 123 may be formed between the lid 125 and the gas distribution plate assembly 120. The plenum 123 is in fluid communication with a gas panel 130 utilized to provide processing gas to processing volume 111 through a top surface 124 of the gas distribution plate assembly 120 that faces the substrate supporting surface 113 of the substrate support assembly 112.

In one embodiment, the gas distribution plate assembly 120 is electrically conductive and can function as an electrode for generating a capacitively coupled plasma 115 in the processing volume 111 between the gas distribution plate assembly 120 and the substrate support assembly 112. In one embodiment, the gas distribution plate assembly 120 may be coupled to an RF power source 150 through an RF matching network 151 to generate the plasma 115. Thus, the gas distribution plate assembly 120 may be part of an RF delivery path. During processing, the substrate support assembly 112 is part of an RF return path that returns RF current back to the RF power source 150. An electrical insulator 116 is disposed between the gas distribution plate assembly 120 and the chamber body 110 to provide electrical isolation between the RF delivery and the RF return paths.

The gas distribution plate assembly 120 includes a base plate 121 and a plurality of protective elements 122. In one embodiment, the gas distribution plate assembly 120 includes a frame member 128 surrounding the base plate 121 to shield the base plate 121 from the plasma 115.

The base plate 121 includes a front side 121a and a backside 121b. The front side 121a may be a planar, concave, convex, curved or complex surface. The shape of the front side 121a may be circular, rectangular, or any suitable shape for a processing chamber. The base plate 121 may have a mounting flange 133 for facilitating coupling of the base plate 121 to the lid 125. In one embodiment, the base plate 121 is formed from an RF conductive material, such as a metallic material, for example, aluminum. The base plate 121 may be substantially disk-shaped body. Alternatively, the base plate 121 may be formed from one or more plates stacked together.

A plurality of gas delivery holes 126 are formed through the base plate 121, extending from the backside 121b to the front side 121a of the base plate 121. Each gas delivery hole 126 forms a portion of a respective gas delivery path 205. In one embodiment, the gas delivery holes 126 are evenly distributed across the base plate 121. In one embodiment, the flow resistance or length of the gas delivery holes 126 may be selected to control the radial profile of gas flow through the gas distribution plate assembly 120.

A plurality of mounting holes 127 are formed in the base plate 121. The mounting hole 127 may be a through or blind hole. Each mounting hole 127 engages a respective one of the protective elements 122. The mounting holes 127 allows the protective elements 122 to be attached to the base plate 121 from the front side 121a. The mounting holes 127 may have a circular opening. In another embodiment, the mounting holes 127 have another shape to allow the protective element 122 to be coupled to the base plate 121 in a predefined orientation.

The plurality of protective elements 122 extend from the front side 121a of the base plate 121 to form the top surface 124 of the gas distribution plate assembly 120. The top surface 124 substantially shields the base plate 121 from the plasma 115. The top surface 124 may have a planar, concave, convex, curved or complex surface facing the substrate support assembly 112, which may be the same or different than the shape of the front side 121a of the base plate 121.

FIG. 2 is a schematic partial sectional view of the gas distribution plate assembly 120 showing the base plate 121 and the protective elements 122 according to one embodiment of the present invention. The plurality of protective elements 122 are discrete structures attached to the front side 121a of the base plate 121. Individual protective element 122 may have the same or different designs.

The protective elements 122 are coupled to the base plate 121 and form a unitary structure therewith. The protective elements 122 may optionally be coupled to the base plate 121 in a manner that facilitates replacement of one or more of the protective elements 122. The protective elements 122 may be coupled to the base plate 121 in any suitable manner. In one embodiment, each protective element 122 generally includes a body 201 and a shank 202 extending from the body 201. The body 201 has a top surface 204 and a back surface 206. The top surface 204 faces the substrate support assembly 112 and forms the top surface 124 of the gas distribution plate assembly 120. The shank 202 extends from the back surface 206 into the mounting hole 127 formed in the base plate 121. The body 201 of the protective elements 120 may have any suitable shape, for example, a regular or irregular polygon, such as hexagonal, pentagonal, triangular, rectangular, or square as desired. The body 201 of the protective elements 122 may also have different thicknesses, such that when mounted to the base plate 121, the top surface 124 of the gas distribution plate assembly 120 may be concave, convex or have another non-planar shape. It is contemplated that the protective element 122 may only have a body 201 without a shank 202, and that the body 201 may be directly coupled to the base plate 121, for example, using adhesives or other suitable bond.

The shape and spacing of the bodies 201 are arranged so that the top surfaces 204 of the protective elements 122 substantially covers the front side 121a of the base plate 121, thereby protecting the base plate 121 from the plasma. The top surfaces 204 of the protective elements 122 may have the same or different shapes, but are generally designed to abut in a tiled fashion so that the edges of the top surfaces 204 of adjacent protective elements 122 are aligned and form a gap 203 having a uniform width.

The top surface 204 may have planar orientation perpendicular to a centerline extending through the shank 202. The top surface 204 may alternatively have planar orientation non-perpendicular to the centerline extending through the shank 202. The top surface 204 may alternatively be curved or rounded. The rotational orientation of the protective elements 122 within the mounting holes 127 may be set so that transition between the top surfaces 204 of adjacent bodies 201 results in a smooth top surface 124 of the gas distribution plate assembly 120 even if the resultant top surface 124 has a planar or curved sectional profile.

The gap 203 allows the body 201 of each protective element 122 to freely expand when exposed to high temperature, thus avoiding stress generation and rubbing which could generate particles. In one embodiment, the gaps 203 also define a portion of the gas distribution path 205. As shown in FIG. 2, the gas distribution path 205 through the gas distribution plate assembly 120 along arrows 205 includes the gas delivery hole 126 formed in the base plate 121 and the gaps 203 defined between the protective elements 122.

The top surface 204 of each protective element 122 may have the same or different shapes. The top surfaces 204 may or may not form a pattern over the base plate 121. The edges of the top surfaces 204 of adjacent protective element 122 align. In one embodiment, the top surfaces 204 of the protective elements 122 have the same shape and are evenly distributed across the base plate 121. In one embodiment, the top surfaces 204 of the protective elements 122 have form a pattern when the protective elements 122 are mounted to the base plate 121. In one embodiment, the pattern formed by the protective elements 122 is a repeating pattern. In another embodiment, the pattern formed by the protective elements 122 is a polar array. In yet another embodiment, the pattern formed by the protective elements 122 is a grid. The surface area of the top surface 204 of each the protective elements 122 coupled to the base plate 121 may be uniform across the top surface 124. Alternatively, the surface area of the top surface 204 of the protective elements 122 coupled to the base plate 121 may be not be uniform across the top surface 124.

In one embodiment, the surface area of the top surface 204 of at least one of the protective elements 122 coupled to the center of the base plate 121 is greater than the surface area of the top surface 204 of at least one of the protective elements 122 coupled to the edge of the base plate 121. In another embodiment, the surface area of the top surface 204 of at least one of the protective elements 122 coupled to the center of the base plate 121 is less than the surface area of the top surface 204 of at least one of the protective elements 122 coupled to the edge of the base plate 121. In this manner, the lateral distribution profile of processing gas exiting the top surface 124 of the gas distribution plate assembly 120 may be tailored to suit a particular processing need.

Each protective element 122 is attached to base plate 121 directly without any bonding material or intervening structures. The direct contact between each of the protective elements 122 and the base plate 121 ensures good heat transfer, thus enhancing temperature control of the top surface 124. For example, good heat transfer between each of the protective elements 122 and the base plate 121 promotes temperature uniformity of the top surface 124. The direct contact between the base plate 121 and the protective elements 122 improves thermal diffusivity of the gas distribution plate assembly 120. The improved thermal diffusivity allows heat to be transferred in an increased rate across the base plate 121 and with the protective elements 122, thus, greatly reducing hot spots and improving processing uniformity.

As shown in FIG. 2, the shank 202 of the protective element 122 may be inserted into the mounting hole 127 of the base plate 121 so that the back surface 206 of the body 201 is disposed against the front side 121a of the base plate 121. At least one of the shank 202 or the back surface 206 of the body 201 is in direct contact with the base plate 121.

When both protective elements 122 and the base plate 121 are electrically conductive, the direct contact between the protective elements 122 and the base plate 121 ensures good electrical connection so that the protective elements 122 and the base plate 121 share the same electrical potential, thus minimizing the potential of arcing within the gas distribution plate assembly 120. Therefore, no localized discharge may be triggered within the gas distribution plate assembly 120 when RF power is supplied to the base plate 121.

Suitable Material for Protective Elements

The protective elements 122 may be formed by any suitable material that provides protection for the base plate 121 against physical, chemical, or electrical attack. In one embodiment, the protective element 122 may be formed by a non-metallic material that provides protection for a metallic base plate 121 against a plasma and/or chemical attack. In another embodiment, the protective element 122 is formed from a conductive non-metallic material, such as silicon carbide base plated material, graphite, or semiconductor material, such as silicon. In another embodiment, the protective element 122 is formed from a dielectric material. In another embodiment, the protective element 122 is formed from a ceramic material, such as a ceramic material fabricated from metal oxides. For example, the protective element 122 may be formed from aluminum oxide ($Al_2O_3$), or yttrium oxide ($Y_2O_3$). In another embodiment, the protective element 122 may be formed from glass ceramics. In another embodiment, the protective element 122 may be formed from a metal silicide, such as aluminum silicide ($AlSi_2$). In another embodiment, the protective element 122 may be formed from a nitride, such as silicon nitride ($Si_3N_4$), aluminum nitride (AlN), and boron nitride (BN). In another embodiment, the protective element 122 may be formed from sapphire. In another embodiment, the protective element 122 may be formed from silicon oxide, or quartz.

Embodiments of Protective Elements

The protective elements according to the present invention may have any suitable top geometry that allow the discrete elements to be pieced together to form a protective shield over the base plate. The protective element generally includes a body and a shank extending from the body configured for attaching the protective element to the base plate. The body may have various shapes suitable for different arrangements. The shank may be designed for different methods of attachment. The protective elements may be attached to the base plate by any suitable methods that allow the protective elements. In one embodiment, the protective elements are attached to the base plate by a method that ensures direct contact between the protective elements and the base plate, for example an interference fit, clamping, fastening, screwing or bolting the protective element to the base plate.

FIGS. 3A-B are schematic side and bottom views of a protective element 300 according to one embodiment of the present invention. The protective element 300 includes a body 301 having a substantially planar top surface 303 and a back surface 304. The top surface 303 may be a regular hexagon or other suitable shape. A shank 302 extends from the back surface 304.

In one embodiment, the shank 302 is a cylinder. The protective element 300 is configured to be attached to the mounting hole 127 formed in the base plate 121 (not shown in FIG. 3A) using an interference fit. The base plate 121 is heated to a temperature sufficient to expand the mounting hole 127 to a diameter large enough to accommodate the shank 302. In one embodiment, the base plate may be heated up to 250 degrees Celsius. The protective element 300, which may be at a lower, is then installed in the heated base plate 121 by inserting the shank 302 into the mounting hole 127 formed in the base plate 121. When the base plate 121 cools, the diameter of the mounting hole 127 shrinks to securely grip the shank 302 of the protective element 300. A jig may be utilized to ensure a predefined orientation between the protective element 300 and the base plate 121. In use, the plasma heats both the base plate 121 and the protective element 300. When made of non-metallic material, the protective element 300 may have a higher coefficient of thermal expansion relative to the coefficient of thermal expansion of the metallic base plate, thereby ensuring the protective element 300 remains securely attached to the base plate 212 under processing conditions.

Similar to the protective element 120, the body 301 of the protective element 300 may have any suitable shape, for example, a regular or irregular polygon, such as hexagonal, pentagonal, triangular, rectangular, or square as desired. The body 301 of the protective elements 122 may also have different thicknesses as describe body, such that the top surface 124 of the gas distribution plate assembly 120 may be concave, convex or have another non-planar shape.

FIGS. 3C-D are schematic side and bottom views of a protective element 310 according to one embodiment of the present invention. The protective element 310 includes a body 311 having a substantially planar top surface 313 and a back surface 314. A shank 312 extends from the back surface 314. The top surface 313 has a shape of a segment of a ring. The ring segment shaped protective element 310 may be used in forming concentric arrangements of protective elements 310.

FIG. 3E is a schematic side view of a protective element 320 according to another embodiment of the present invention. The protective element 320 includes a body 321 and a shank 322 extends from the body 321. The protective element 320 is similar to the protective element 300 of FIG. 3A, except that a helical thread is formed on at least a portion of the shank 322 so that the protective element 320 may fastened to a threaded mounting hole formed in the base plate.

FIG. 3F is a schematic side view of a protective element 330 according to another embodiment of the present invention. The protective element 330 includes a body 331 and a threaded shank 332 extends from the body 331. The protective element 330 is similar to the protective element 320 of FIG. 3E, except that the shank 332 is long enough to allow the body 331 of the protective element 330 to be pulled against the base plate 121 by a nut 333.

Arrangement of Protective Elements

The gas distribution plate assembly according to embodiments of the present invention may include a plurality of protective elements attached to a base plate in a pattern selected to obtain uniform performance. In one embodiment, a repeating pattern may be formed by protective elements having bodies of the same shape. In another embodiment, a non-repeating pattern may be formed by protective elements of having bodies of different shape, for example the protective elements may form a pattern with concentric rings on a circular base plate. FIGS. 4 and 5 illustrate two exemplary arrangements.

FIG. 4 is a bottom view of a gas distribution plate assembly 400 according to one embodiment of the present invention. The gas distribution plate assembly 400 includes a plurality of hexagonal protective elements 401 formed in a honeycomb pattern. In some embodiments used with a circular base plate, some protective elements 411 near the edge region may be truncated to conform with circular contour of the base plate. In some embodiments used with a circular base plate, some protective elements 421 near the edge region may be larger to fill the space in which a truncated protective element could not fit, for example by having substantially hour-glass or roughly figure eight shape. In yet other embodiments, a void 431 at the perimeter of the base plate defined between protective elements wherein a truncated protective element could not fit may be covered by a frame 128 (shown in phantom), such as illustrated in FIG. 1. The arrangement of repetitive protective elements allows for easy replacement should any protective element become damaged.

FIG. 5 is a bottom view of a gas distribution plate assembly 500 according to another embodiment of the present invention. The gas distribution plate assembly 500 includes a plurality of protective elements 501 forming a pattern of concentric rings. Protective elements 501 sharing the same radial distance from center can be identical. Protective elements 501 at different radial locations are different. The number of protective elements 501 in each radial location may be increase with increase of the radius. In one embodiment, gaps 502 defined between protective elements 501 positioned at a first common radius are staggered from gaps 502 defined between protective elements 501 positioned at a second common radius to improve flow uniformity. Alternatively, the protective elements 501 can be connected to a recursive plenum to improve flow uniformity. The concentric arrangement allows controls and adjustment among radial zones.

It should be noted that embodiments of the present invention contemplate other suitable arrangements of the protective elements on the base.

Gas Distribution Paths

Embodiments of the present invention provide various configurations to form gas distribution paths through the base plate and the protective elements for various needs. In the embodiment shown in FIG. 2, the gas distribution path 205 includes the gas delivery hole 126 formed in the base plate 121 and the gap 203 defined between neighboring protective elements 122. The gas delivery hole 126 is aligned with the gap 203.

Figure 6A:
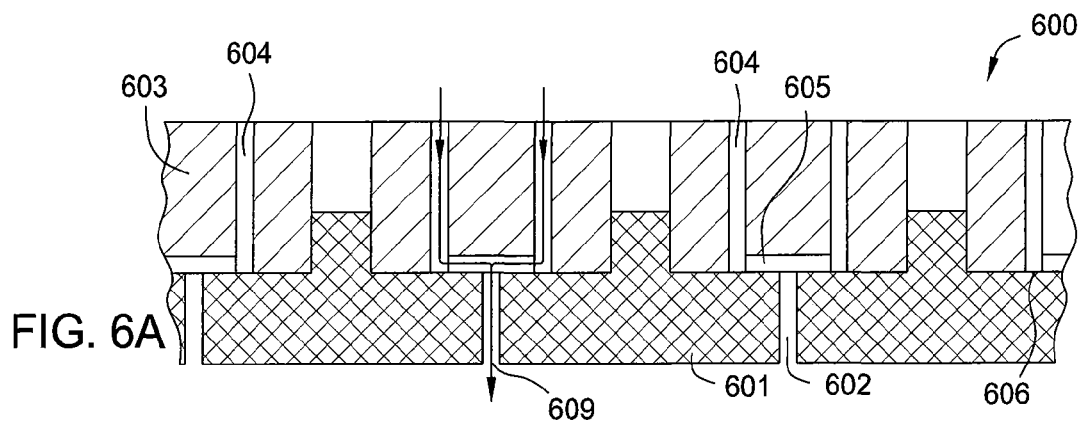
FIG. 6A is a partial sectional view of a gas distribution plate assembly having gas paths formed between gaps of neighboring protective elements.

FIG. 6A is a partial sectional view of a gas distribution plate assembly 600 having non-linear gas distribution paths 609 that include gas delivery holes 604 formed through a base plate 603 and gaps 602 defined between neighboring protective elements 601. Unlike the gas distribution path 205 of FIG. 2, the gas delivery hole 604 in the base plate 603 does not align with the gap 602. Instead, the gas delivery hole 604 is blocked by the body of the protective element 601. Grooves 605 are formed in at least one of the body of the protective element 601 and a lower surface 606 of the base plate 603. The grooves 605 are part of the gas distribution path 605 and fluidly connect the gas delivery holes 604 and the gaps 602. The non-linear gas distribution paths 609 of the gas distribution plate assembly 600 keeps the gas in plenum (such as the plenum 123 shown in FIG. 1) behind the base plate 603 from being in the line of sight of the plasma formed within the processing volume.

Figure 6B:
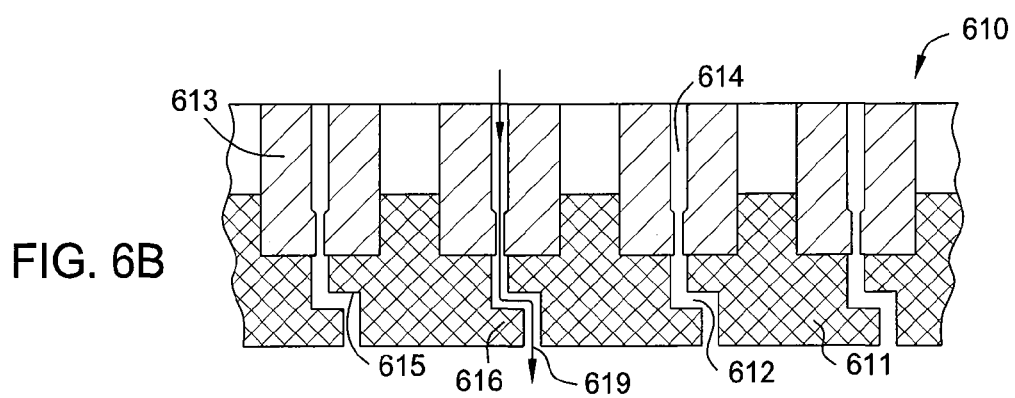
FIG. 6B is a partial sectional view of a gas distribution plate assembly having gas paths formed between gaps of overlapping neighboring protective elements.

FIG. 6B is a partial sectional view of a gas distribution plate assembly 610 having non-linear gas distribution paths 619 that include a gas delivery hole 614 formed in a base plate 613 and gaps 612 defined between overlapping neighboring protective elements 611. Each protective element 611 has a step 615 formed on one side and a flange 616 formed on the other side. The flange 616 of one protective element 611 overlaps with the step 615 of the neighboring protective element 611 forming a zig-zagging gap 612 therebetween. Even though the gas delivery holes 614 align with one portion of the gaps 612, the gas plenum behind the base plate 613 is not within the line of sight of the plasma because of the overlapping step 615 and flange 6161 of the zig-zagging gap 612.

Figure 6C:
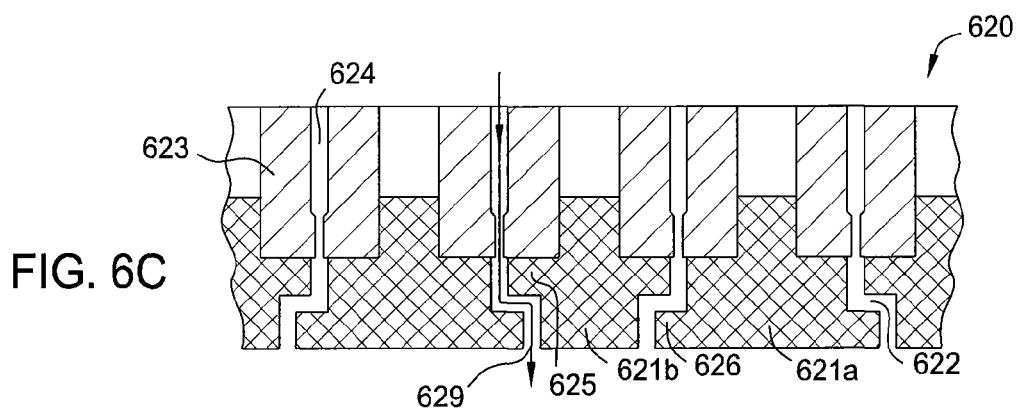
FIG. 6C is a partial sectional view of a gas distribution plate assembly having gas paths formed between gaps of overlapping neighboring protective elements.

FIG. 6C is a partial sectional view of a gas distribution plate assembly 620 having non-linear gas distribution paths 629 include a gas delivery hole 624 in a base plate 623 and gaps 622 of overlapping neighboring protective elements 621a, 621b. The protective elements 621a, 621b overlaps with each other forming zig-zagging gaps 622 therebetween. The gas plenum behind the base plate 623 is not within the line of sight of the plasma because of the non-linear gas delivery path 629 caused by the zig-zagging gap 622. Unlike the gas distribution plate assembly 610 in which each protective element 611 has a step and a flange, there are two kinds of protective elements 621a, 621b arranged in alternating manner to form the zig-zagging gaps 622. The protective element 621a has a flange 626 and the protective element 621b has a step 625.

Figure 6D:
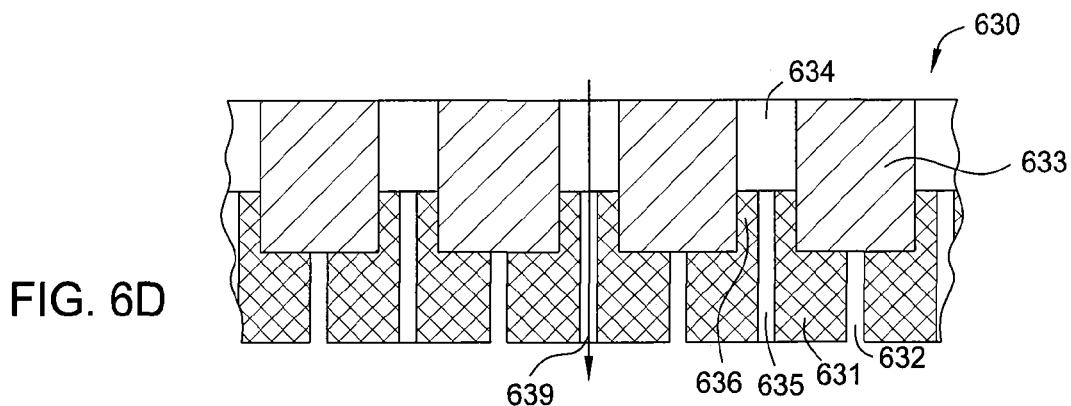
FIG. 6D is a partial sectional view of a gas distribution plate assembly having gas paths formed in a through hole of each protective element.

FIG. 6D is a partial sectional view of a gas distribution plate assembly 630 having a linear gas distribution path 639. The gas distribution plate assembly 630 includes protective elements 631 disposed in mounting holes 634 formed in a base plate 633. The mounting hole 634 also serves as a gas delivery hole through the base plate 633. Each protective element 631 has a through hole 635 formed through a shank 636 and body of the protective element 631. When the shank 636 is inserted into the mounting hole 634, the fluid connection of the mounting hole 634 and through hole 635 form the gas distribution path 639. Gaps 632 between the protective elements 631 are not part of the gas distribution passage. Having the distribution path 639 extend through the protective element 631 advantageously minimized clogging of the distribution path 639 and allows the gas distribution plate assembly 630 to be cleaned more efficiently and manufactured less expensively.

Profile Variation

The discrete protective elements according to embodiments of the present invention also provide great flexibility and convenience for process control. For example, the discrete nature of the protective elements allows a profile of the substrate facing surface to be varied by changes of protective elements and/or the base plate. For example, the profile of the top surface of the gas distribution plate facing the substrate may be non-planar, which is nearly impossible for form using traditional methods because of the difficulties in manufacturing a curved ceramic protective cover.

Figure 7A:
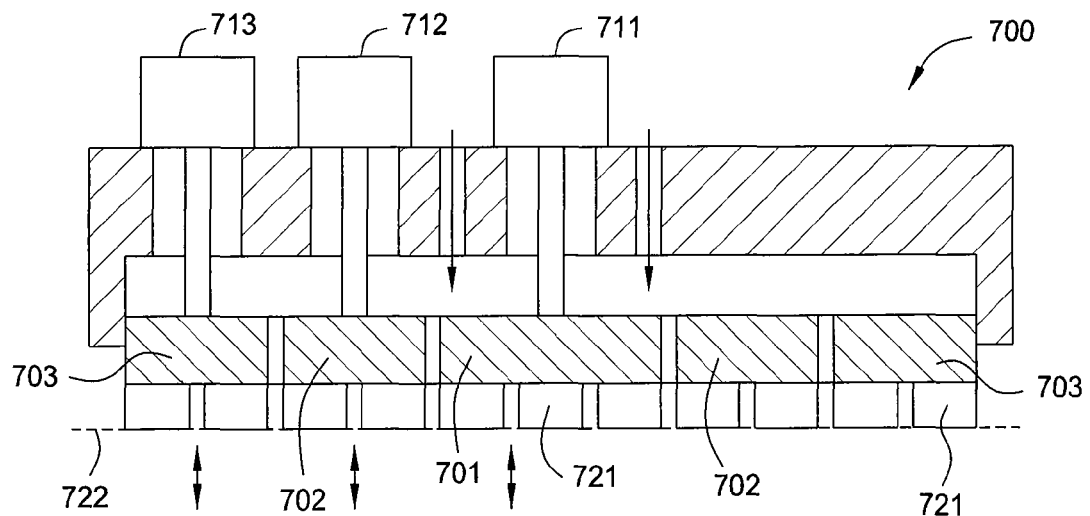
FIG. 7A is a sectional view of a gas distribution plate assembly with an adjustable base plate according to one embodiment of the present invention.
Figure 7B:
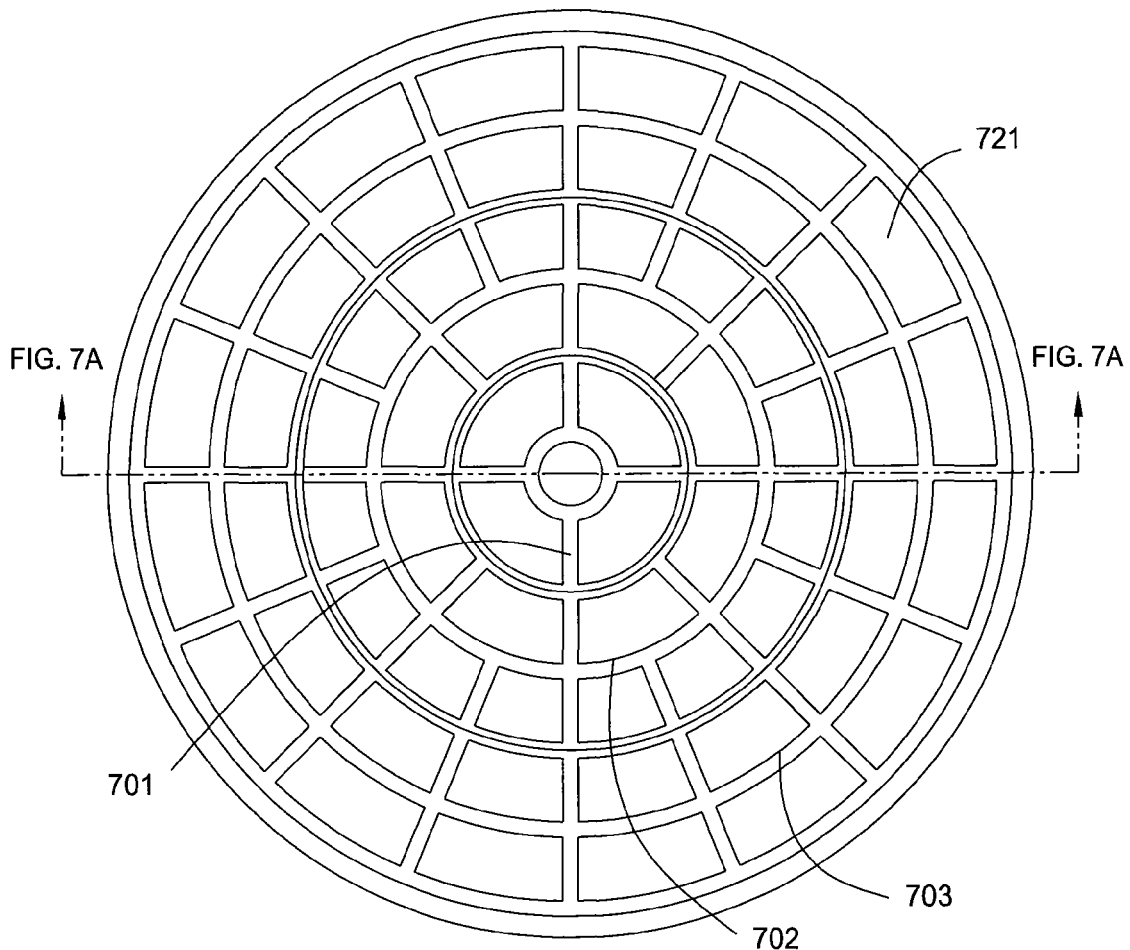
FIG. 7B is a schematic bottom view of the gas distribution plate assembly of FIG. 7A.

FIGS. 7A-B are sectional and bottom views of a gas distribution plate assembly 700 with an adjustable base plate according to one embodiment of the present invention. The gas distribution plate assembly 700 includes a base plate having plurality of base plate members which may be displaced relative to each other. The base plate members may be positioned in any suitable arrangement. In the embodiment depicted in FIG. 7A, three base plate members 701, 702, 703 are shown by way of example and not be limitation arranged in concentric rings. A plurality of protective elements 721 are attached to the base plate members 701, 702, 703. The protective elements 721 form a top surface 722 that protects the base plate.

In one embodiment, each base plate member 701, 702, 703 is attached to a respective actuator 711, 712, 713. The actuators 711, 712, 713 are configured to move the base plate member 701, 702, 703 vertically relatively to one another. The base plate members 701, 702, 703 may move to control the planarity of the top surface 722 of the gas distribution plate assembly 700 to define a planar, convex, concave or undulating surface.

Alternatively, a non-planar to surface of the gas distribution plate assembly 700 may be formed by using a non-planar base plate and/or using protective elements having different thicknesses.

Figure 8A:
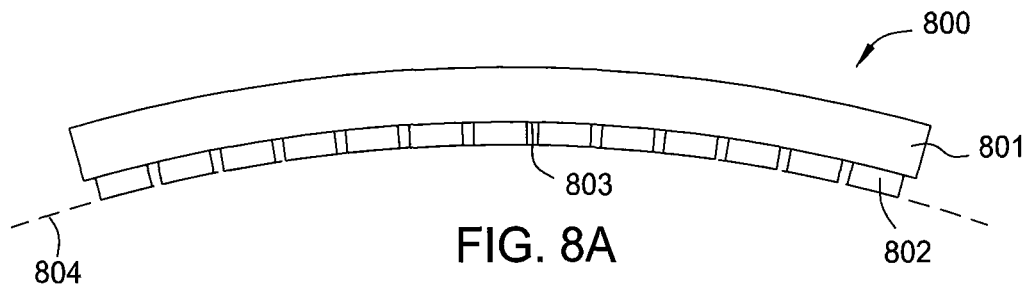
FIG. 8A is a side view of a gas distribution plate assembly having a concave base plate according to one embodiment of the present invention.

FIG. 8A is a side view of a gas distribution plate assembly 800 having a concave base plate 801 according to one embodiment of the present invention. The base plate 801 has a concave lower surface 803. A plurality of protective elements 802 are attached to the lower surface 803 and form a concave substrate facing surface 804. In the embodiment depicted in FIG. 8A, the plurality of protective elements 802 have equal thicknesses.

Figure 8B:
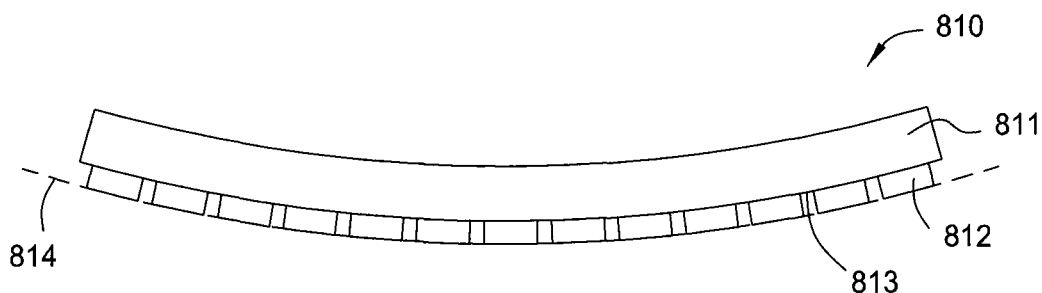
FIG. 8B is a side view of a gas distribution plate assembly having a convex base plate according to one embodiment of the present invention.

FIG. 8B is a side view of a gas distribution plate assembly 810 having a convex base plate 811 according to one embodiment of the present invention. The base plate 811 has a convex lower surface 813. A plurality of protective elements 812 are attached to the lower surface 813 and form a convex substrate facing surface 814. In the embodiment depicted in FIG. 8B, the plurality of protective elements 812 have equal thicknesses.

Figure 8C:
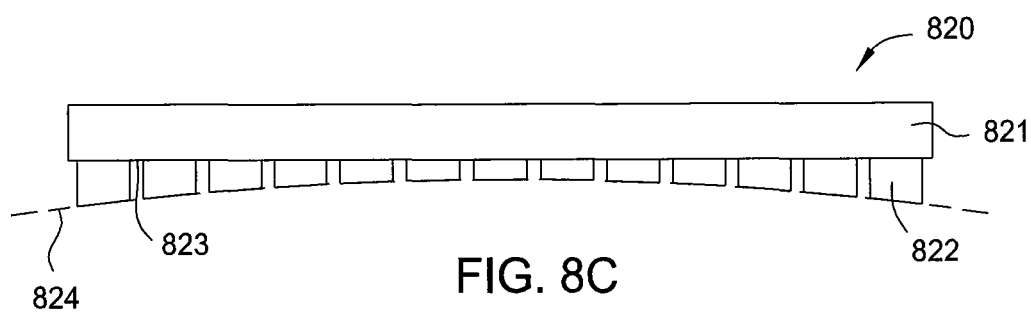
FIG. 8C is a side view of a gas distribution plate assembly having protective elements with variable thickness forming a concave profile according to one embodiment of the present invention.

FIG. 8C is a side view of a gas distribution plate assembly 820 having protective elements 822 with different thicknesses coupled to a base plate 821 has a planar lower surface 823. Using protective elements 822 with different thicknesses allows the surface of the gas distribution plate assembly 820 to have a concave profile 824. For example, the thickness of the protective elements 822 may increase radially the farther protective elements 822 are located from the center of the gas distribution plate assembly 820 to forming the concave profile 824.

Figure 8D:
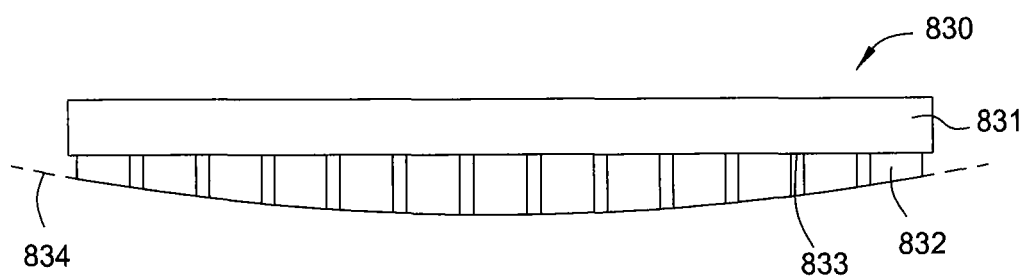
FIG. 8D is a side view of a gas distribution plate assembly having protective elements with variable thickness forming a convex profile according to one embodiment of the present invention.

FIG. 8D is a side view of a gas distribution plate assembly 830 having protective elements 832 with different thicknesses forming a convex profile 834 according to one embodiment of the present invention. A base plate 831 has a planar lower surface 833. The thickness of the protective elements 832 may decrease radially the closer the protective elements 822 are located to the center of the gas distribution plate assembly 830 to form the convex profile 834.

Embodiments of the present invention provide various advantages. For example, the discrete protective elements are smaller than traditional protective plates, and are scalable, replaceable, and easy to manufacture. The discrete protective elements also are less stressed during use.

The discrete protective elements according to embodiments of the present invention also provide flexibility and convenience of maintenance and have a lower replacement cost since the base plate may be reused. Additionally, a single protective element may be replaced if damaged, thereby reducing replacement costs.

Embodiments of the present invention eliminate the use of bonding material, thus reducing the potential of unwanted discharge due to the high electric fields across the bonding material. Potential particle contamination and out-gassing from the bonding materials are also eliminated. Non-uniformity and erosion caused by non-uniform thickness of the bonding material are also eliminated. High thermal stress due to temperature differences across the bond material and differential heating across gas distribution plate are minimized.

Embodiments of the present invention also allow the protective element and the base plate to operate at the same electrical potential, thereby reducing the potential of localized discharge during plasma processing.

The contact surfaces on the protective elements and the base plate can be recursive to improve thermal diffusivity of the entire structure, thus improving heat transfer across the gas distribution plate.

Additionally, gas flow through gaps between the protective elements can be uniform. In concentric ring design, gas flow in each radial segment is determined by flow diffuser. Azimuthally uniform flow can be achieved with combination of flow diffuser and element design.

Even though circular gas distribution plate assemblies are described with embodiments of the present invention, persons skilled in art would recognize that embodiments of the present invention may be used in gas distribution plates of any shapes.

Even though gas distribution plate assemblies are described with embodiments of the present invention, persons skilled in art would recognize that embodiments of the present invention may be used in any chamber components that need a protective shield.

While the foregoing is directed to embodiments of the present invention, other and further embodiments of the invention may be devised without departing from the basic scope thereof, and the scope thereof is determined by the claims that follow.

What is claimed is:

1. A gas distribution plate assembly comprising:
a base plate having a plurality of gas delivery holes extending from a backside to a front side of the base plate;
a plurality of protective elements in direct contact with the base plate, the protective elements substantially covering the front side of the base plate and having a top surface facing away from the front side of the base plate; and
a plurality of gas delivery paths extending from the backside of the base plate to the top surface of the protective elements, the plurality of gas delivery holes forming a portion of the gas delivery paths.

2. The gas distribution plate assembly of claim 1, wherein at least one of the protective elements comprises:
a body having a back surface facing away from the top surface; and
a shank extending from the back surface of the body, wherein the body and the shank are formed from a plasma resistive material, and the shank is disposed in a hole formed in the base plate.

3. The gas distribution plate assembly of claim 1, wherein the top surface is substantially planar.

4. The gas distribution plate assembly of claim 1, wherein the top surface is curved.

5. The gas distribution plate assembly of claim 2 further comprising:
a through hole formed through the shank and the body, the through hole forming a portion of a corresponding one of said gas delivery paths.

6. The Gas distribution plate assembly of claim 3, wherein a portion of the plurality of gas delivery paths are defined by gaps between the plurality of protective elements.

7. The gas distribution plate assembly of claim 2, wherein at least a portion of the shank is threaded.

8. The gas distribution plate assembly of claim 2, wherein each shank of the protective element is interference fit to the base plate.

9. The gas distribution plate assembly of claim 1, wherein at least one of the protective elements has a polygonal top surface.

10. The gas distribution plate assembly of claim 1, wherein at least one of the protective elements has a top surface in the form of a ring segment.

11. A gas distribution plate assembly comprising:
an RF conductive base plate having a front side and a backside; and
a plurality of plasma resistive protective elements directly in contact with the base plate and covering the front side of the base plate to define a top surface of the gas distribution plate assembly, wherein a plurality of gas distribution paths extend from the backside of the base plate to the top surface of gas distribution plate assembly.

12. The gas distribution plate assembly of claim 11, wherein the plurality protective element form a pattern on the base plate.

13. The gas distribution plate assembly of claim 12, wherein the pattern has a concentric form.

14. The gas distribution plate assembly of claim 12, wherein the pattern has a grid form.

15. The gas distribution plate assembly of claim 11, wherein each of the gas distribution paths comprises:
a first portion formed through the base plate; and
a second portion formed through the protective elements.

16. The gas distribution plate assembly of claim 11, wherein each of the gas distribution paths comprises:
a first portion formed through the base plate; and
a second portion formed through a gap between neighboring protective elements.

17. The gas distribution plate assembly of claim 16, wherein the neighboring protective elements overlap.

18. The gas distribution plate assembly of claim 17, wherein the gas distribution paths are non-linear in the second portions formed through the gaps between the overlapping protective elements.

19. The gas distribution plate assembly of claim 11, wherein at least a first group of the plurality of protective elements are movable relative to a second group of the plurality of protective elements to adjust a profile of the top surface of the gas distribution plate assembly.

20. The gas distribution plate assembly of claim 11, wherein at least one of the protective elements has a polygonal top surface.

* * * * *

UNITED STATES PATENT AND TRADEMARK OFFICE
CERTIFICATE OF CORRECTION

PATENT NO. : 9,068,265 B2  
APPLICATION NO. : 13/363342  
DATED : June 30, 2015  
INVENTOR(S) : Lubomirsky et al.

Page 1 of 1

It is certified that error appears in the above-identified patent and that said Letters Patent is hereby corrected as shown below:

In the Claims:

Column 13, Claim 6, Line 36, please delete "Gas" and insert --gas-- therefor.

Signed and Sealed this  
Twenty-second Day of December, 2015

Michelle K. Lee  
*Director of the United States Patent and Trademark Office*